United States Patent
Chowdhury et al.

(10) Patent No.: US 10,333,291 B2
(45) Date of Patent: Jun. 25, 2019

(54) MULTIPLE GENERATOR GROUND FAULT DETECTION

(71) Applicant: Schweitzer Engineering Laboratories, Inc., Pullman, WA (US)

(72) Inventors: Ritwik Chowdhury, Toronto (CA); Dale S. Finney, Little Bras D'or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/106,567

(22) Filed: Aug. 21, 2018

(65) Prior Publication Data
US 2019/0097418 A1   Mar. 28, 2019

Related U.S. Application Data

(60) Provisional application No. 62/562,750, filed on Sep. 25, 2017.

(51) Int. Cl.
*H02H 7/06* (2006.01)
*H02H 1/00* (2006.01)
*G01R 31/02* (2006.01)
*G01R 31/34* (2006.01)

(52) U.S. Cl.
CPC .............. *H02H 7/06* (2013.01); *G01R 31/025* (2013.01); *G01R 31/346* (2013.01); *H02H 1/0007* (2013.01)

(58) Field of Classification Search
CPC .......... H01H 47/002; H02H 3/05; H02H 7/06; G01R 31/34; G01R 21/001; G01R 19/2513; G01R 31/343
See application file for complete search history.

(56) References Cited

U.S. PATENT DOCUMENTS 2,881,319 A   4/1959   Sills
3,727,123 A   4/1973   Smith
3,973,171 A   8/1976   Howell
(Continued)

FOREIGN PATENT DOCUMENTS

CN   203324449 U   12/2013
JP   53107640      9/1978
(Continued)

OTHER PUBLICATIONS

Rik Pintelon, Johan Schoukens, System Identification: A Frequency Domain Approach, Section 4.3 (pp. 119-131), Jan. 1, 2001.
(Continued)

*Primary Examiner* — Rina I Duda
(74) *Attorney, Agent, or Firm* — Bradley W. Schield; Richard M. Edge

(57) ABSTRACT

Detection and protection against electric power generator stator ground fault conditions in multiple-generator high-impedance grounded installations is provided herein. In one embodiment, a generator protection element may block a determination of a fault using third harmonic voltages when the third harmonic voltage from the generator is less than a factor of the maximum third harmonic voltage from all of the generators on the common bus. A tripping subsystem may issue a trip command based upon detection of a stator ground fault condition.

20 Claims, 13 Drawing Sheets

(56) References Cited

U.S. PATENT DOCUMENTS

| | | |
|---|---|---|
| 4,000,464 A | 12/1976 | Nussel |
| 4,001,646 A | 1/1977 | Howell |
| 4,029,951 A | 6/1977 | Berry |
| 4,066,950 A | 1/1978 | Rumold |
| 4,088,935 A | 5/1978 | D'Atre |
| 4,148,087 A | 4/1979 | Phadke |
| 4,156,186 A | 5/1979 | Wolfinger |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 4,982,147 A | 1/1991 | Lauw |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,365,396 A | 11/1994 | Roberts |
| 5,471,880 A | 12/1995 | Lang |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,963,404 A | 10/1999 | Guzman-Casillas |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,308,140 B1* | 10/2001 | Dowling ............ G01R 31/343 |
| | | 324/765.01 |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,496,757 B1 | 12/2002 | Flueck |
| 6,525,504 B1 | 2/2003 | Nygren |
| 6,714,020 B2 | 3/2004 | Hobelsberger |
| 6,721,671 B2 | 4/2004 | Roberts |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1* | 8/2007 | Kasztenny ........... H02H 1/0092 |
| | | 324/509 |
| 7,304,403 B2 | 12/2007 | Xu |
| 7,498,818 B2 | 3/2009 | Benmouyal |
| 7,528,611 B2* | 5/2009 | Kasztenny ........... H02H 1/0092 |
| | | 324/509 |
| 7,532,010 B2 | 5/2009 | Kamel |
| 7,592,772 B2 | 9/2009 | Nandi |
| 7,652,859 B2* | 1/2010 | Finney ................ H01H 47/002 |
| | | 361/191 |
| 7,693,607 B2 | 4/2010 | Kasztenny |
| 7,710,693 B2 | 5/2010 | Guzman-Casillas |
| 7,804,303 B2 | 9/2010 | Benmouyal |
| 8,405,940 B2 | 3/2013 | Schweitzer, III |
| 9,007,731 B2* | 4/2015 | Finney .................... H02H 3/05 |
| | | 361/42 |
| 9,496,707 B2* | 11/2016 | Thompson ............. H02H 7/06 |
| 2001/0001534 A1 | 5/2001 | Lawson |
| 2002/0128759 A1 | 9/2002 | Sodoski |
| 2002/0140433 A1 | 10/2002 | Lawson |
| 2003/0085715 A1 | 5/2003 | Lubkeman |
| 2005/0033481 A1 | 2/2005 | Budhraja |
| 2006/0125486 A1 | 6/2006 | Premerlani |
| 2007/0085549 A1 | 4/2007 | Fischer |
| 2008/0074810 A1 | 3/2008 | Guzman-Casillas |
| 2009/0039655 A1 | 2/2009 | Berchowitz |
| 2009/0160454 A1 | 6/2009 | Johansson |
| 2009/0219030 A1 | 9/2009 | Salem |
| 2009/0254297 A1 | 10/2009 | Bengtsson |
| 2010/0126674 A1* | 5/2010 | Lin ....................... E06B 9/262 |
| | | 160/84.03 |
| 2010/0194324 A1 | 8/2010 | Kasztenny |
| 2011/0085272 A1 | 4/2011 | Schweitzer |
| 2011/0158783 A1 | 6/2011 | Molitor |
| 2012/0112758 A1 | 5/2012 | Weems |
| 2012/0265457 A1* | 10/2012 | Donolo ................ G01R 31/343 |
| | | 702/58 |
| 2013/0300209 A1 | 11/2013 | Long |
| 2015/0051852 A1 | 2/2015 | Pan |
| 2015/0222122 A1 | 8/2015 | Nuqui |
| 2016/0025811 A1 | 1/2016 | Kasztenny |
| 2016/0049891 A1 | 2/2016 | Frampton |
| 2016/0181790 A1 | 6/2016 | Thompson |

FOREIGN PATENT DOCUMENTS

| | | |
|---|---|---|
| JP | 56002569 | 1/1981 |
| JP | 03212117 | 9/1991 |
| JP | 07177646 | 7/1995 |
| JP | 11133093 | 5/1999 |
| JP | 2000333359 | 11/2000 |
| WO | WO0239642 | 5/2002 |
| WO | WO2014067742 | 5/2014 |

OTHER PUBLICATIONS

Beckwith Electric Co., Inc., M-3425A Generator Protection flyer, 2001.

Beckwith Electric Co., Inc., M-3425A Generator Protection Instruction Book, 2004.

Siemens AG, Numerical Machine Protection Manual 7UM515 V3.1, Published 1996.

ABB, Type DGF Generator Field Relay Instruction Leaflet, ABB Inc. Feb. 1977.

J.Lewis Blackburn, Protective Relaying Principles and Applications, Chapter 8: Generator Protection, pp. 262-267, 1997.

Tyco Electronics Energy Division, Installation and Operating Instructions R.O.C.O.F. Protection Relay, Issue 1, Nov. 2002.

PCT/US2010/052452, Patent Cooperation Treaty, International Search Report and Written Opinion of the International Searching Authority, dated Dec. 9, 2010.

Dale Finney and Gerald Johnson, Loss of Prime Mover (Antimotoring) Protection, IEEE Tutorial on the Protection of Synchronous Generators, Special Publication of the IEEE Power System Relaying Committee, Second Ed., Chapter 3, Section 5, 2011.

IEEE, IEEE Guide for AC Generator Protection, IEEE Std C37.102-1006, pp. 68-70, 2007.

Michael Simpson and John Merrell, Low Zero-Sequence Impedances on Generators, Aug. 30, 2000.

Mu Longhua and Li Xiaobo, Selective Ground-fault Protection Using an Adaptive Algorithm Model in Neutral Ungrounded Power Systems, IEEE International Conference on Power System Technology, Dec. 2000.

(56) References Cited

OTHER PUBLICATIONS

PCT/US2015/056870, Patent Cooperation Treaty, International Search Report and Written Opinion of the International Searching Authority, dated Jan. 14, 2016.
Benmouyal, G. "The Impact of Synchronous Generators Excitation Supply on Protection Relays". Schweitzer Engineering Laboratories, Inc. Oct. 29, 2007.
PCT/US2015/041950 Patent Cooperation Treaty, International Search Report and Written Opinion of the International Searching Authority, dated Oct. 16, 2015.
Schweitzer Engineering Laboratories, Inc., SEL-300G Generator Relay flyer, Jun. 22, 2007.
Klingerman, Nathan, Et al., "Understanding Generator Stator Ground Faults and Their Protection Schemes", Presented at the 42nd Annual Western Protective Relay Conference, Oct. 2015.
Seckwith Electric Co., Inc., Application Note #27, "Beckwith Electric M-3425A Generator Protection Relay Setting Clarification 27TN Third Harmonic Undervoltage Element", Dec. 13, 2004.
Siemens, Siprotec 5 Generator Protection 7UM85 Manual, Sections 6.7-6.9, Nov. 2015.

\* cited by examiner

MULTIPLE GENERATOR GROUND FAULT DETECTION

RELATED APPLICATIONS

The present application claims the benefit under 35 U.S.C. § 119(e) of U.S. Provisional Patent Application No. 62/562,750, entitled "Multiple Generator Ground Fault Detection", filed Sep. 25, 2017, which is herein incorporated by reference in its entirety and for all purposes.

TECHNICAL FIELD

This disclosure relates to techniques that may be utilized to detect stator ground faults in a high-impedance grounded electric power generator connected to a common bus with another high-impedance grounded electric power generator. More particularly, but not exclusively, the present disclosure is applicable to providing secure third-harmonic ground fault protection to a generator connected to a common bus with at least one additional generator.

BRIEF DESCRIPTION OF THE DRAWINGS

Non-limiting and non-exhaustive embodiments of the disclosure are described, including various embodiments of the disclosure with reference to the figures, in which.

Figure 1:
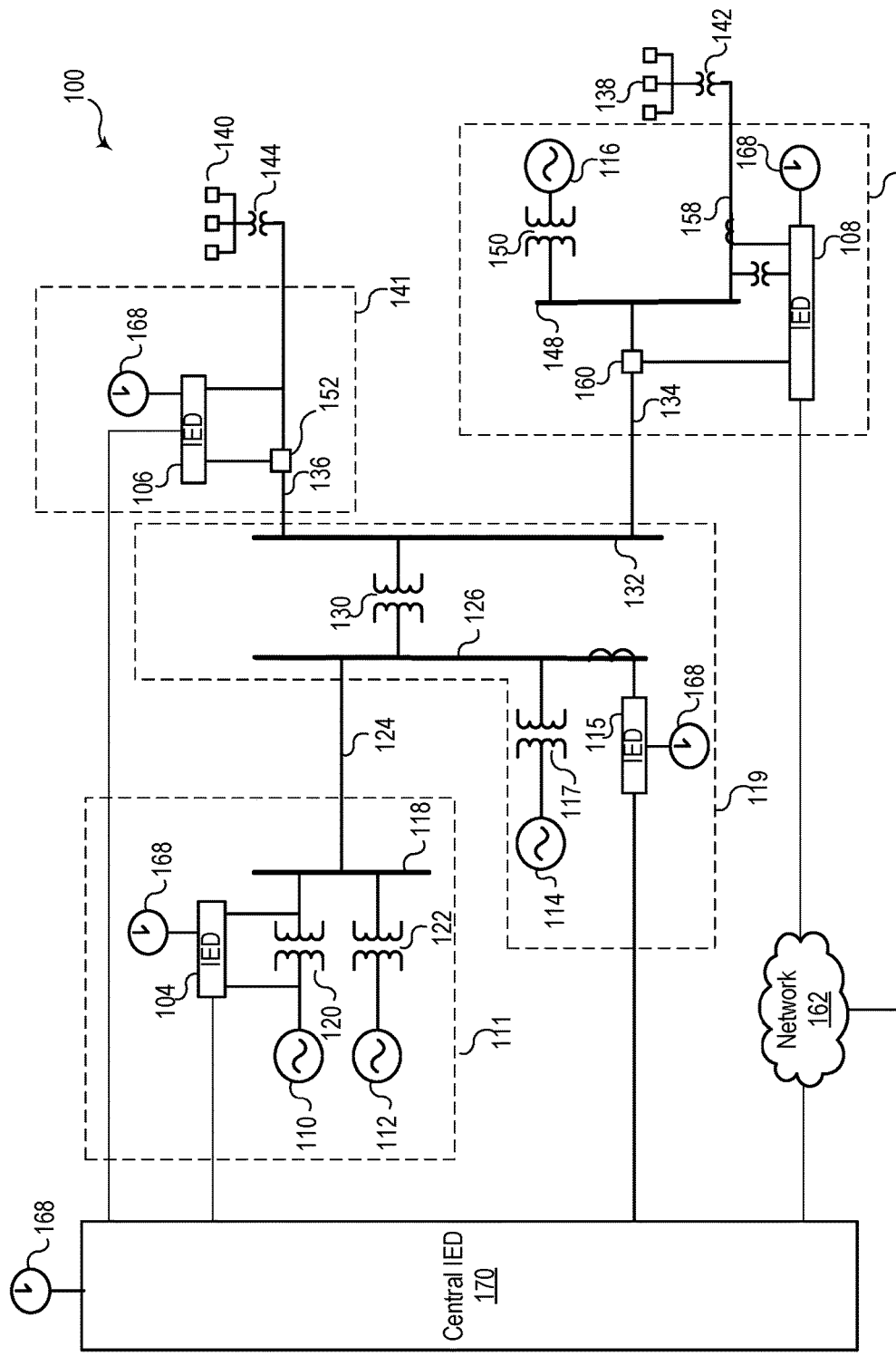
FIG. 1 illustrates an example of an embodiment of a simplified one-line diagram of an electric power delivery system with various substations consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power generators may experience a variety of stator faults including, for example, stator winding-to-winding faults, stator winding-to-ground faults (also known as stator ground faults), and the like. Prompt and secure detection of such faults followed by fast tripping of the generator may result in a reduction of damage to the generator caused by the fault in the stator. In certain embodiments, the apparatuses and methods discussed herein may be advantageously used to detect stator winding-to-ground faults, which is the most likely fault-type in a generator.

The method of ground fault detection on an electric power generator depends on the type of machine grounding employed. For units that are solidly grounded or low-impedance (resistance/reactance) grounded, there is sufficient fault current available to measure. Consequently, elements that use current as an operating signal e.g. overcurrent (50/51N), directional-overcurrent (67N), ground differential (87N), restrictive earth fault (REF) etc. can sensitively detect stator faults including winding-to-winding faults and stator ground faults.

For high-impedance (resistance/resonant) grounded systems or ungrounded systems, ground fault currents are limited to very low values by the grounding impedance and the capacitances around the generator. Protection elements that use current provide very limited sensitivity. However, there is sufficient voltage available during a fault instead providing a mechanism to detect stator-ground faults. The fundamental neutral over-voltage (59N) function provides stator-ground fault protection coverage for a majority (e.g. 90%) of ground faults in the upper stator-winding region (e.g., windings electrically closer to the terminals than the neutral). However, a fault close to the neutral, such as a fault within the remaining windings closer to the neutral than the terminals, does not cause a significant imbalance in the fundamental voltage quantities and places a limit on the sensitivity of 59N. Accordingly, additional protection is needed to detect faults on 100% of the stator windings.

During normal operation, the third harmonic and other harmonics are present in the generator voltages. These harmonics exist due to a non-sinusoidal winding function and non-uniform air-gap. The internal air-gap voltage ($E_{ag}$) drives the flux which, in turn, produces the voltage. $E_{ag}$ varies with machine loading.

Both the neutral and terminal voltages are typically measured. When the terminal voltages are measured via Y-grounded potential transformers (PT), the measured third-harmonic voltages can be used to provide neutral side protection for the generator.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components.

Some of the infrastructure that can be used with embodiments disclosed herein are already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of an embodiment of a simplified one-line diagram of an electric power delivery system 100 with various substations consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, and 158), circuit breakers (e.g., breakers 152 and 160), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

The electric power delivery system 100 illustrated in FIG. 1 may include a generation substation 111. Substation 111 may include various generators 110 and 112 connected to a bus 118 through step-up transformers 120 and 122. Bus 118 may be connected to bus 126 in substation 119 via transmission line 124. Although the equipment in substation 111 may be monitored and/or controlled by various IEDs, only a single IED 104 is shown. IED 104 may be a transformer protection IED for transformer 120.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, 170 may receive a common time signal 168. The time signal may be distributed in system 100 using a communications network 162 or using a common time source, such as a Global Navigation Satellite System ("GNSS"), or the like.

In various embodiments, one or more of generators 110, 112, 114, or 116 may be susceptible to damage from a stator fault. The generators 110, 112, 114, and 116 may be monitored and/or controlled by an IED configured to identify stator ground fault using a calculated third harmonic voltage of the stator and trip the generator upon detection of a fault condition.

Figure 2A:
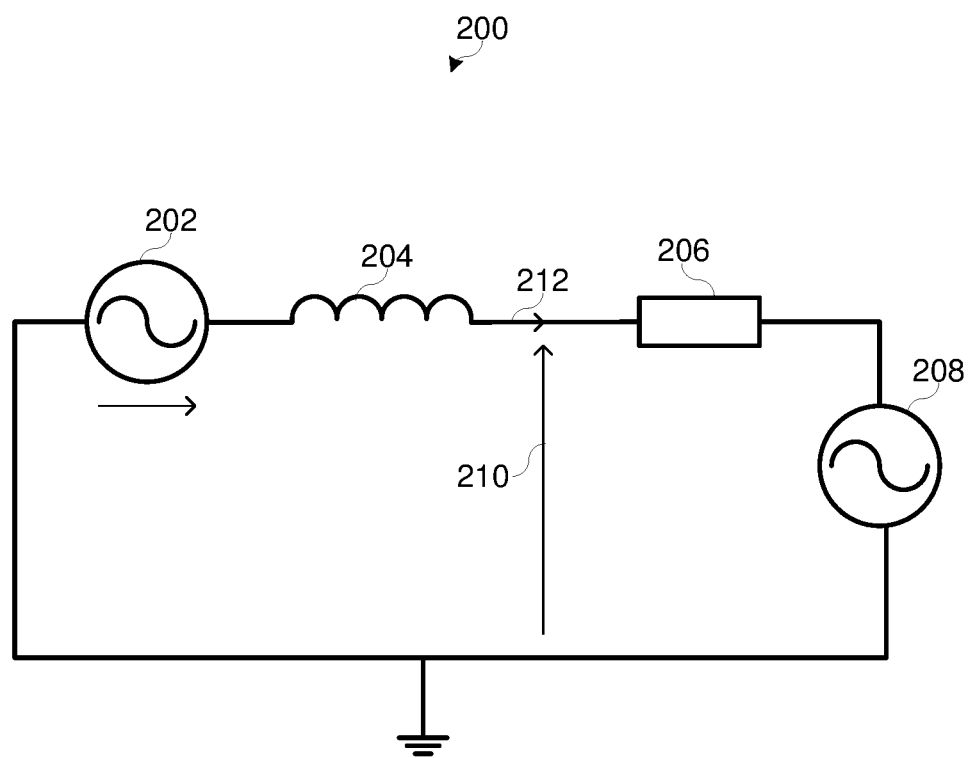
FIG. 2A illustrates a representative simplified circuit diagram of the fundamental components of an electric power generator, in accordance with an embodiment.

FIG. 2A illustrates a simplified diagram of an equivalent fundamental circuit of a generator 200. The equivalent circuit includes an internal voltage $E_i$ 202. Current from the source 202 flows through source impedance 204, which depends on the generator's synchronous impedances $X_d$, $X_q$. Current $I_t$ 212 flows through system impedance $Z_{sys}$ 206 and system equivalent source voltage $V_{sys}$ 208. Voltage $V_t$ 210 may be measured across the terminals along with the current $I_t$. As mentioned above, IEDs may be used to monitor operation of the generator 200. For example, an IED may include sensors to monitor the terminal voltage $V_t$ 200 and a neutral voltage $V_n$ (shown in FIG. 4).

Figure 2B:
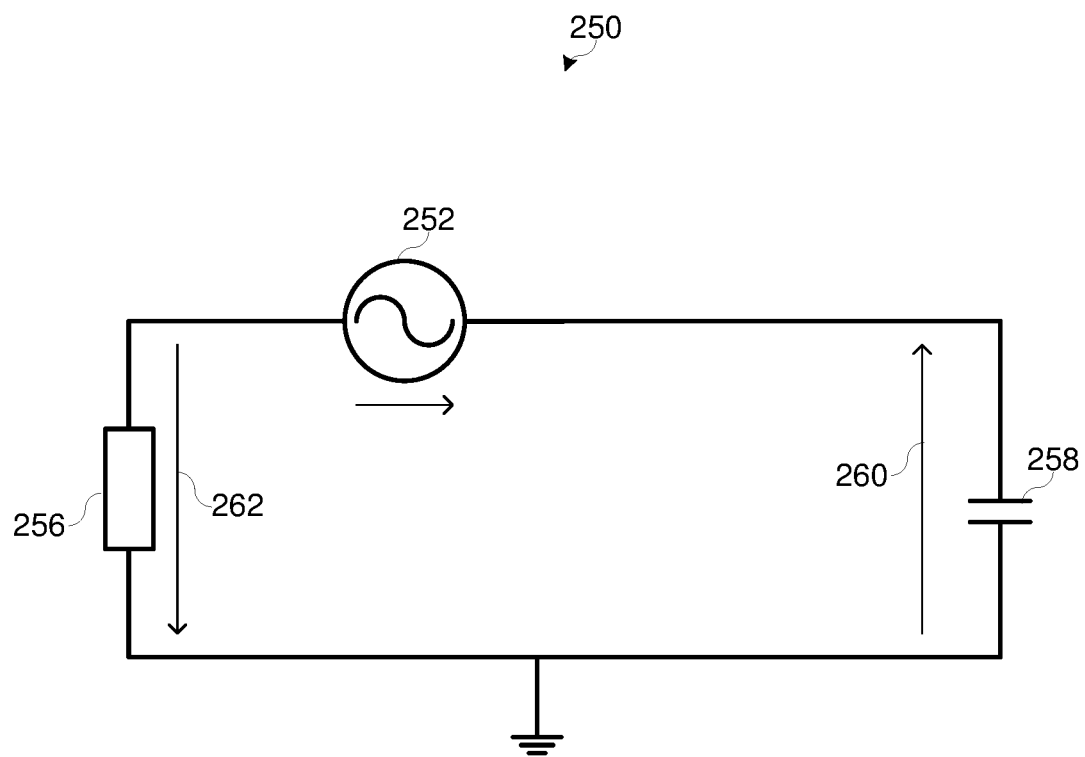
FIG. 2B illustrates a representative simplified circuit diagram of third harmonic components of an electric power generator, in accordance with an embodiment.

FIG. 2B illustrates a simplified diagram of an equivalent third harmonic circuit of a generator 250. A third harmonic neutral voltage VN3 262 and third harmonic terminal voltage VT3 260 may be used to provide stator ground protection as provided herein. The phasor sum of the two voltages VN3 262 and VT3 260 result in the generator third harmonic voltage VG3 252. The equivalent circuit 250 also illustrates the neutral impedance Zn3 256 which is a combination of the parallel neutral-grounding impedance and contribution from the stator-ground capacitance, and terminal capacitance Xt3 258 which has contribution from the machine's stator-ground capacitance, surge capacitance and GSU winding-to-ground capacitances. The third harmonic voltage at terminals VT3 260 may be a filtered third harmonic voltage obtained from the terminal voltage VT 210 which drops across Xt3 258. The third harmonic neutral voltage VN3 may be a filtered third harmonic neutral voltage between the neutral of the generator and the ground.

The ratio of the neutral voltage third harmonic VN3 to the generator third harmonic voltage VG3 may be used to detect stator ground faults. In normal (unfaulted) conditions, the ratio of VN3/VG3 remains relatively constant at a value ranging from 0.40 to 0.80, depending on the impedance network around the high-impedance grounded unit. Accordingly, a fault may be detected when the ratio is less than a pickup value. The pickup may be a per-unit stator winding desired to be protected. The pickup value may be, for example 0.15 in per-unit. While VG3 is typically calculated as a phasor sum of VN3 and VT3, it may also be obtained directly by a PT measuring the zero-sequence voltage from the generator terminals with respect to the neutral.

Figure 3:
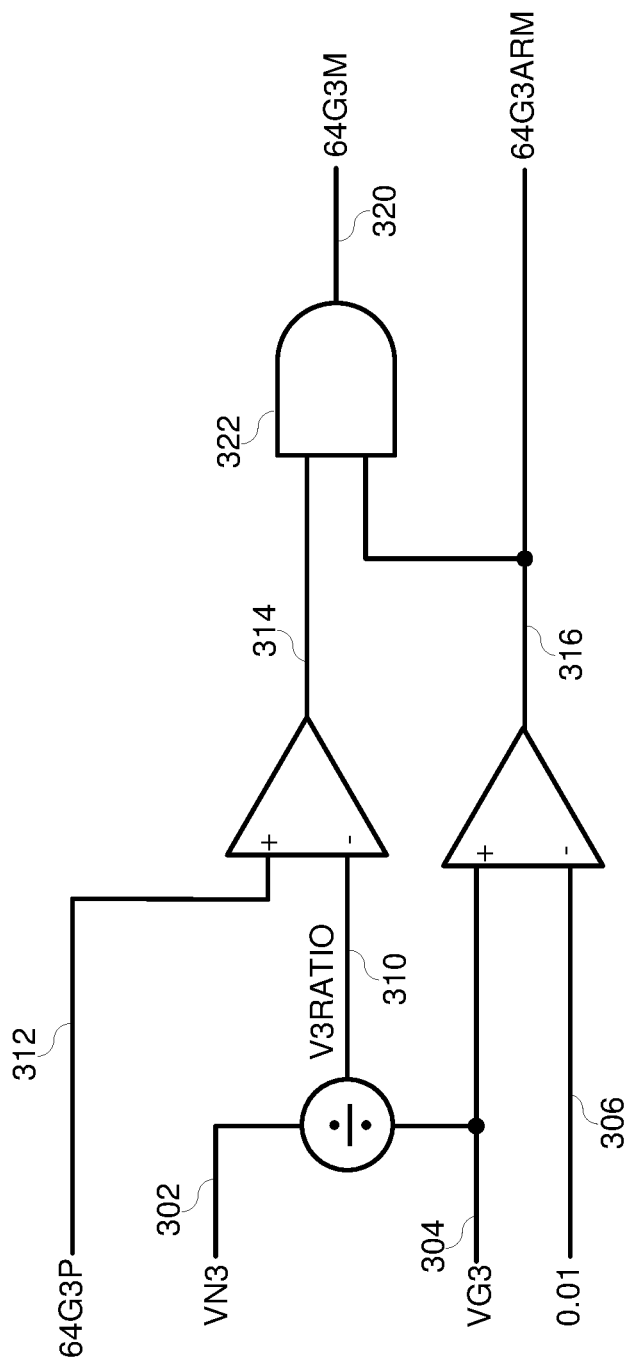
FIG. 3 illustrates logic useful for calculating the third harmonic ratio element pickup value, in accordance with an embodiment.

FIG. 3 illustrates a logic diagram for applying stator ground protection when the third harmonic voltage ratio magnitude V3RATIO 310 is less than the stator ground pickup element threshold 64G3P 312, a setting. The V3RATIO is calculated by dividing the measured neutral third harmonic voltage magnitude VN3 302 (which may be normalized in a per-unit value) by a third harmonic voltage magnitude VG3 304 (which may be normalized in a per-unit value). Although further elements are present in the logic diagram as illustrated, the stator fault condition may be determined simply using the comparison of the ratio with the threshold setting as described herein.

To increase the security of stator ground fault detection, the system may require satisfaction of additional elements before declaring a stator ground fault 320. For example, the stator ground fault signal 314 may be an input to AND gate 322, which may require further inputs before declaring the stator ground fault signal 320. For example, a check may be made to determine that the third harmonic voltage is sufficiently large before the stator ground fault 320 is declared. That is, VG3 should be greater than a percentage of the generator nominal voltage (0.01 p.u. as shown in FIG. 3). In such an instance, the AND gate 322 may provide the stator ground fault signal 320 upon occurrence of both signals 314 and 316. As stated above, signal 316 provides additional security to the stator ground fault protection.

In one embodiment, the third harmonic terminal voltage and third harmonic neutral voltage may be used to determine a stator ground fault in a differential element. The following equation may be used to determine that a stator ground fault exists when the pickup value is exceeded:

$$k*VT3-VN3 > \text{Pickup} \qquad \text{Eq. 1}$$

where k may be a setting that may be estimated as a ratio of the third harmonic neutral voltage to the third harmonic terminal voltage over the entire operating range of the generator. The pickup value may be set by the user to provide an adequate balance between security and coverage. Note that in some embodiments the quantities k, VT3 and VN3 are scalars indicating the magnitude of the quantities, whereas in other embodiments they can be phasors.

In another embodiment, the third harmonic terminal voltage and third harmonic neutral voltage may be applied using an alternate ratio definition. The following equation may be used to determine that a stator ground fault exists when the pickup value is exceeded:

$$VT3/VN3 > \text{Pickup} \qquad \text{Eq. 2}$$

where Pickup is a value that is set to a value above the ratio of the third harmonic terminal voltage to the third harmonic neutral voltage over the entire operating range of the generator. The pickup value may be set by the user to provide an adequate balance between security and coverage.

In some implementations, multiple generators may be connected to a common bus. In such situations, each generator connected to the common bus may appear as an external third harmonic source. In such cases, there may be a circulating third harmonic current on the system that may decrease the security of the protection. In certain implementations, ground fault protection for configurations with multiple units connected to a common bus may provide coverage for the top 85-95% of the winding using neutral overvoltage protection schemes. This may include tripping units one by one until the faulted unit is isolated. In such configurations, neutral-side protection is not provided. If such protection is provided, it is done so erroneously and misoperations can occur. What is needed is a system to increase coverage and security for stator ground protection to cover 100% of the windings, even where multiple generators are connected to a common bus.

Figure 4:
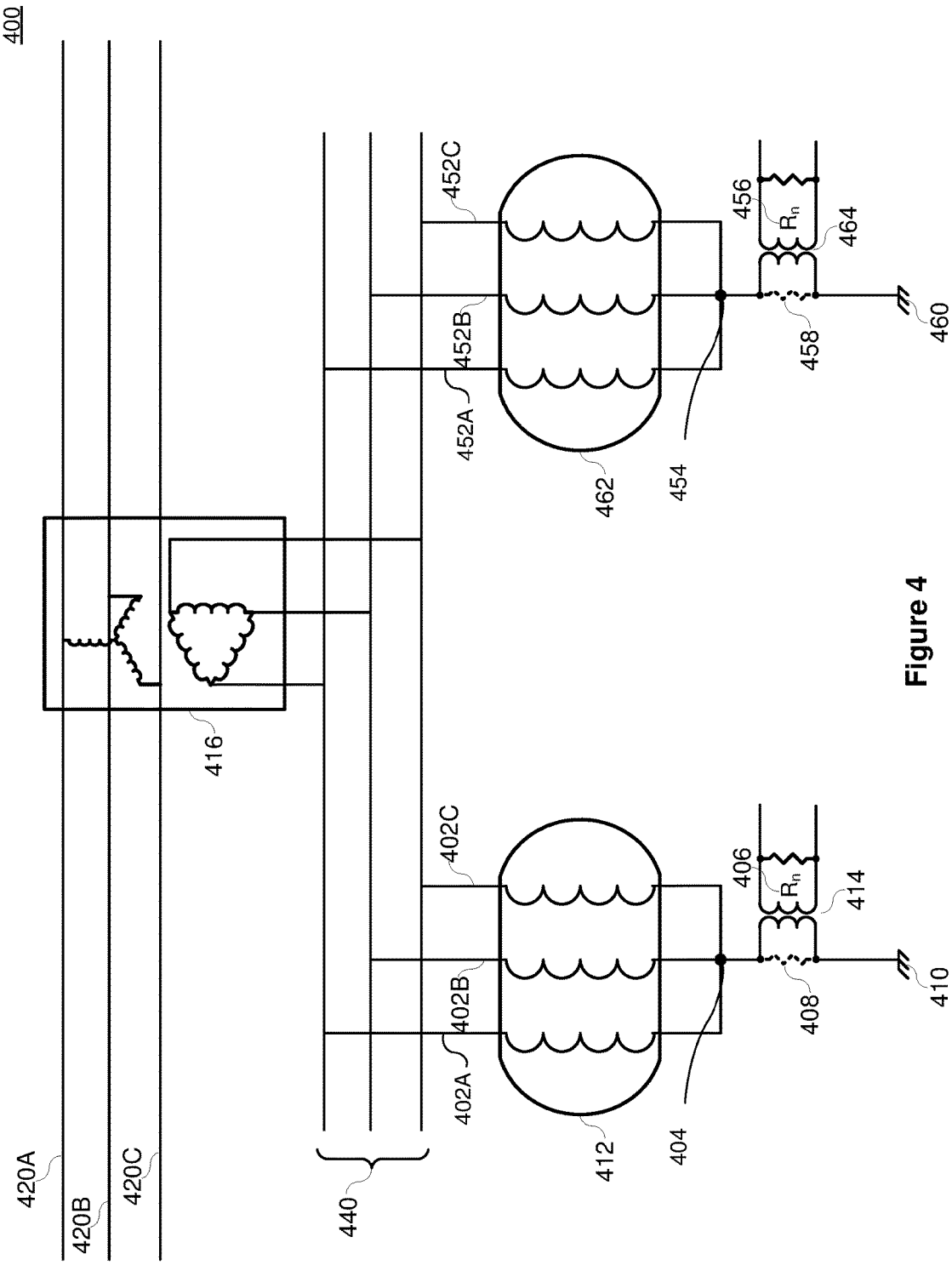
FIG. 4 illustrates a representative simplified diagram of multiple generators connected to a common bus, each generator including a high-impedance neutral grounding resistor (NGR), in accordance with an embodiment.

FIG. 4 illustrates one embodiment of a configuration 400 of multiple generators in connection with a common bus. A first generator 412 and a second generator 462 are in common electrical connection with a generation bus 440, which provides electrical power to power system bus phases 420A, 420B, and 420C via delta-wye transformer 416. Generator 412 may include a stator providing three phases of electrical power to generation bus 440 via contacts 402A, 402B, and 402C. Generator 462 may include a stator providing three phases of electrical power to generation bus 440 via contacts 452A, 452B, and 452C.

Each of the first and second generators 412, 462 may include a separate connection to ground. In some embodiments, the ground connection may be made via a neutral grounding resistor (NGR). For example, a neutral 404 of generator 412 may be in electrical connection with ground 410 via NGR 408; where neutral 454 of generator 462 may be in electrical connection with ground 460 via NGR 458. A voltage across NGR 408 may be monitored across the transformer 414, measuring a voltage drop 406 across NGR 408. Similarly, a voltage across NGR 458 may be monitored across transformer 464, measuring a voltage drop 456 across NGR 458. That is, VN3 described with respect to FIG. 2B may be determined as a third harmonic voltage from the ground 410 with respect to the neutral 404. Further, the VT3 described above may be determined as the mean of the third harmonic voltage of the contacts 402A, 402B, and 402C with respect to ground 410. As is mentioned above, a ground fault on one of the generators may be difficult to detect and locate due to third harmonic current circulating between generators 412 and 462 on the common generation bus 440. It should be noted that although the embodiments herein may be illustrated and described using one or more neutral grounding resistors to provide the high-impedance grounding through a neutral grounding transformer, many embodiments may include other implementations of high-impedance grounding using, for example, a resonant grounded generator with a tuned reactance through a neutral grounding transformer.

Figure 5:
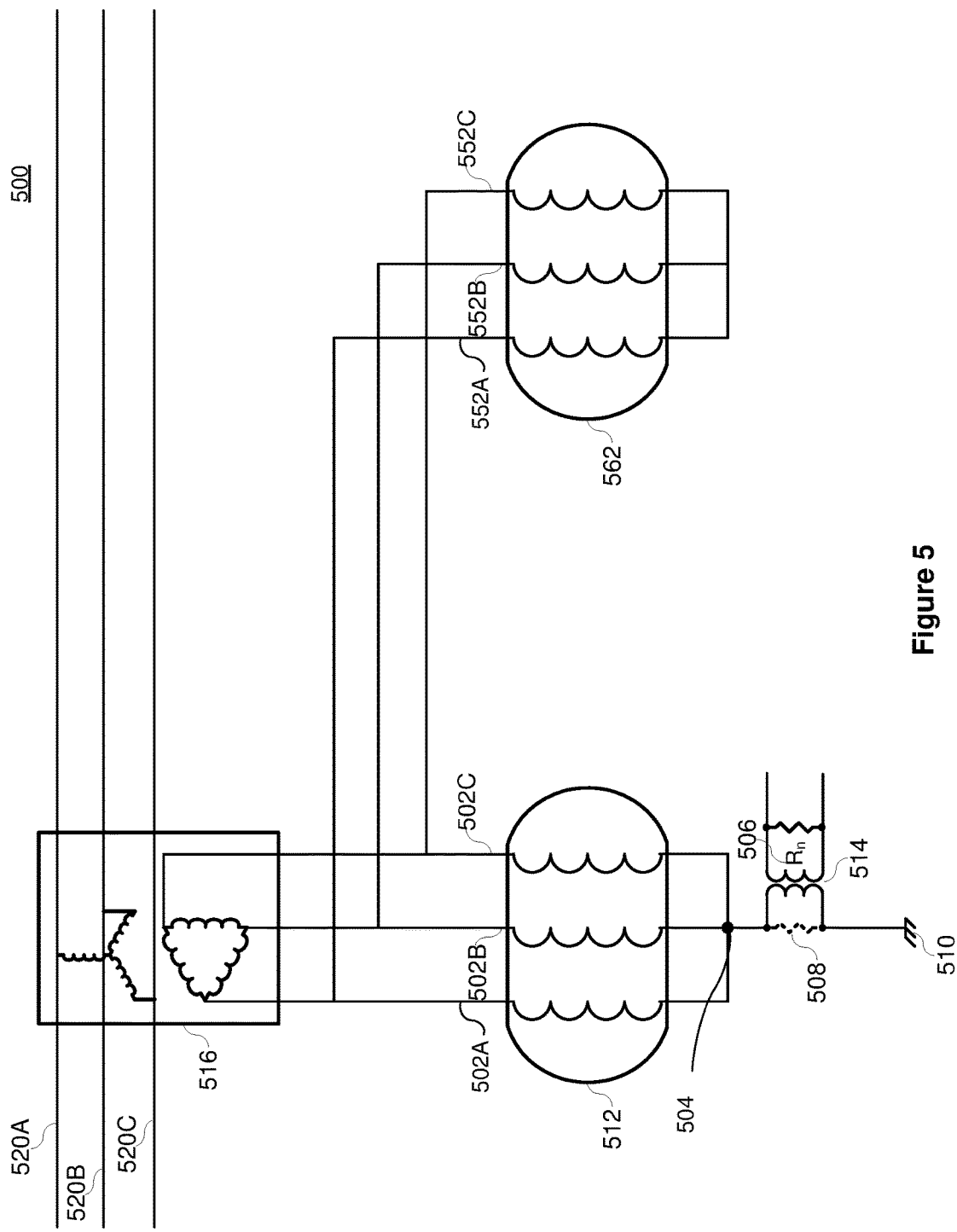
FIG. 5 illustrates a representative simplified diagram of multiple generators connected to a common bus in a cross-compound configuration, in accordance with an embodiment.

FIG. 5 illustrates a representative simplified diagram 500 of multiple generators connected to a common bus in what is often referred to as a "cross-compound" configuration 500. The cross-compound configuration is used in certain steam turbine units with a high-pressure generation unit and a low-pressure generation unit in common electrical connection with an electrical bus. In the illustrated representation, a high-pressure unit includes a first stator 512 with three-phases of electrical outputs 502A, 502B, and 502C in electrical communication with a delta-wye transformer 516 which provides the three phases of electrical power to bus phases 520A, 520B, and 520C. The low-pressure unit includes a second stator 562 with three phase electrical outputs 552A, 552B, and 552C in electrical communication with the three phase outputs of the first stator 512.

The first stator 512 includes a neutral point 504 in electrical communication with ground 510 via NGR 508. A voltage across NGR 508 may be monitored across the neutral grounding transformer 514, to measure a voltage 506 across the NGR 508. In the illustrated embodiment, a single NGR on the first stator 512 (of the high-pressure unit) is shown. However, in various configurations each unit may include separate NGRs, or the second stator 562 may include an NGR to ground.

Figure 6:
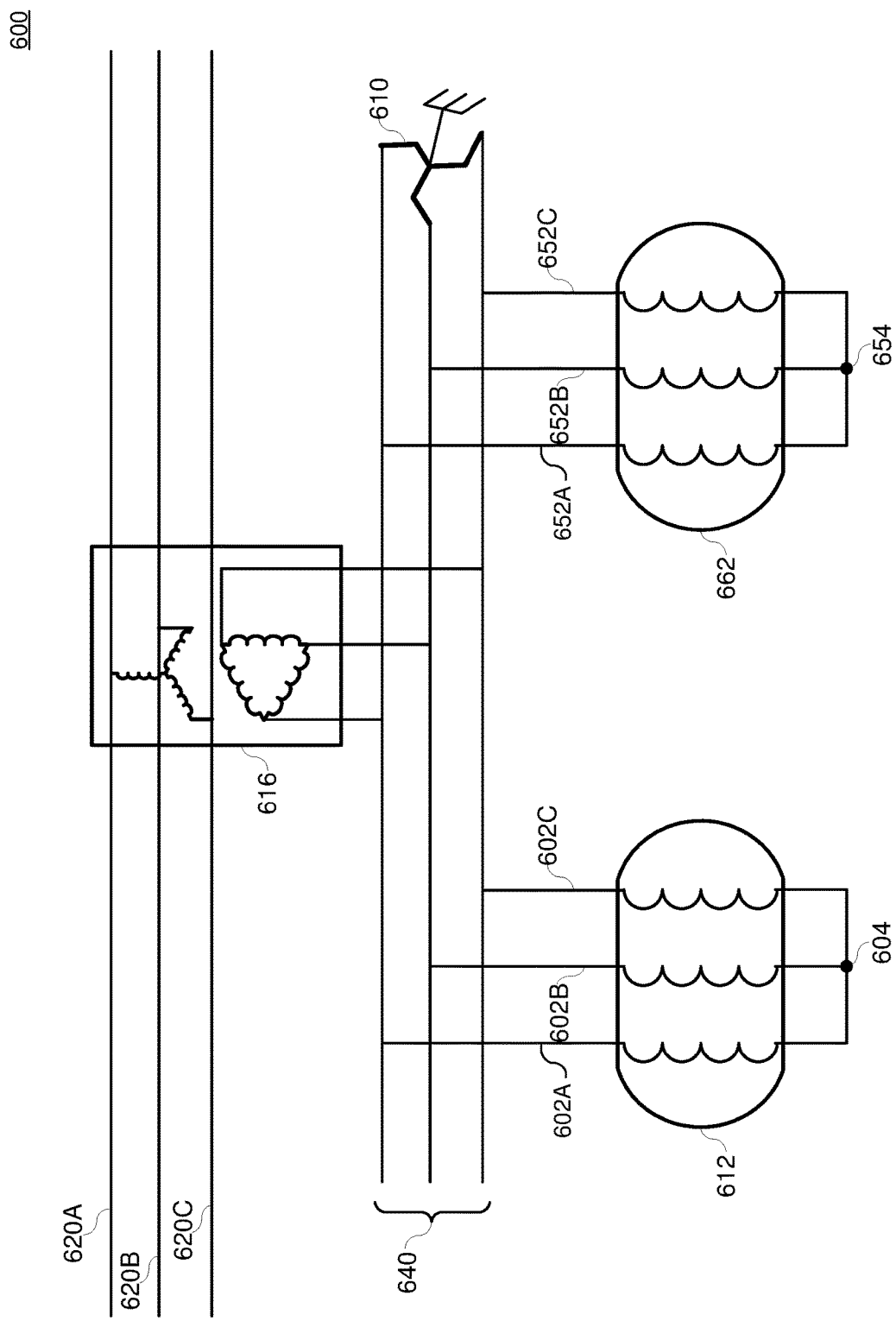
FIG. 6 illustrates a representative simplified diagram of multiple generators with floating neutrals, connected to a common bus with a common grounding transformer, in accordance with an embodiment.

FIG. 6 illustrates another example of a configuration of generator units where identification and location of a generator ground fault may be difficult due to circulating third-harmonic current. Illustrated is a representative simplified diagram 600 of multiple generators with floating neutrals, connected to a common bus with a common grounding transformer. First 612 and second 662 electrical generators provide electrical power to a generation but 640. Although first 612 and second 662 generators include stators, each with a neutral 604, 654, neither of the neutrals 604, 654 are in electrical connection with a ground via an NGR connected thereto. Instead, the first generator is in electrical connection with generation bus 640 via three phase outputs 602A, 602B, and 602C; the second generator is in electrical connection with generation bus 640 via three phase outputs 652A, 652B, and 652C; while the generation bus is electrically grounded via a wye grounding transformer 610. Electrical power is provided to three phases 620A, 620B, and 620C of an electrical bus via a delta-wye transformer 616 in electrical communication with the generation bus 640. This configuration thus includes multiple units with floating neutrals and a common grounding transformer connected to the generation bus.

As described above, FIGS. 4, 5, and 6, illustrate various configurations where detecting and locating a ground fault is difficult due to at least circulating third harmonic current among various generators providing electrical power via a common bus. Generators are often monitored and protected using an intelligent electronic device (IED). IEDs receive electrical measurements from the generator, and use such electrical measurements to determine a state of the generator. If the state of the generator indicates that a fault may be present, the IED may provide a command to remove the generator from service such as, for example, tripping or opening a circuit breaker (or series of circuit breakers) to remove an electrical connection of the generator to the electric power system.

Figure 7:
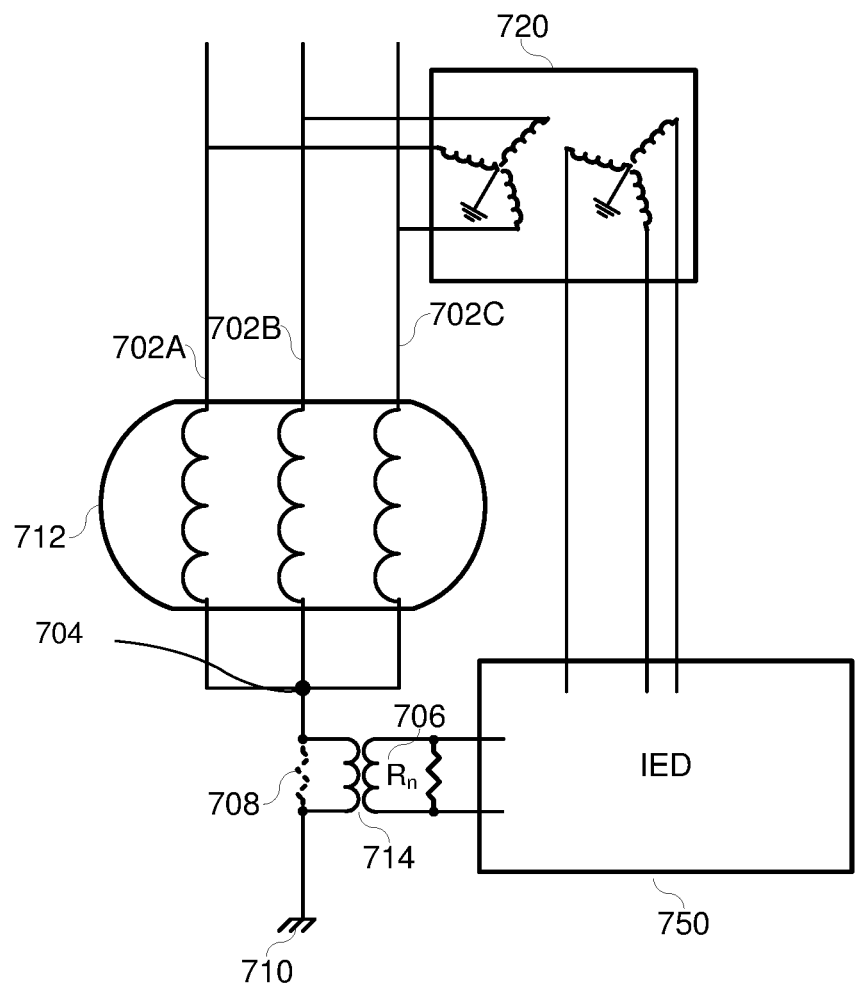
FIG. 7 illustrates a representative simplified diagram of a generator protected by an intelligent electronic device (IED), in accordance with an embodiment.

FIG. 7 illustrates a representative simplified diagram of a generator protected by an IED. The generator 712 may include a stator with a neutral point 704 in electrical communication with ground 710 via, for example, an NGR 708. In certain embodiments, a transformer 714 may be used to obtain measurements of a voltage 706 across the NGR 708. The stator may provide three phases of electrical power to an electric power delivery system via contacts 702A, 702B, and 702C. In certain embodiments, current measurements from the generator output may be measured using CTs on each of the phase conductors or, as illustrated, a wye-wye transformer 720. IED 750 may include inputs to receive measurements from the various devices configured to obtain and provide electrical measurements from the generator, such as PTs, CTs, and the like.

In various embodiments, IED 750 may be configured to detect ground faults on a predetermined portion of the stator windings of the electrical generator 712 using generator ground-fault protection methods with the fundamental voltage measurements obtained from the generator. In certain embodiments, IED 750 may be configured to use fundamental voltage measurements to detect a ground fault in 90-95% of the stator windings, from the terminal side toward the neutral side. In such embodiments, faults in the terminal-side 90-95% of the stator windings may be detected using neutral overvoltage protection, where a voltage at the neutral is measured and compared against a predetermined threshold.

In certain operating conditions, where circulating third harmonic current is not likely to be present, IED 750 may be configured to detect a ground fault on the last 80-100% of the windings toward the neutral side using third-harmonic voltage. Any of the above embodiments for detecting a ground fault using third-harmonic voltage may be used. Furthermore, a simplified third-harmonic voltage ground fault detection technique, as described in equation 2, may be used:

$$\frac{VN3}{VG3} < \text{Pickup} \qquad \text{Eq. 3}$$

where:

VN3 is a measured third harmonic voltage at the neutral;

VG3 is a third harmonic voltage produced by the generator (in one embodiment, this may be a phasor sum of VN3 and VT3);

VT3 is a measured third harmonic voltage at the terminal; and

Pickup is the percentage of the winding toward the neutral side that is intended to be protected, typically 0.15 in per-unit.

Accordingly, using the fundamental neutral overvoltage protection, ground faults in the top 90-95% of the winding may be detected, and using the third-harmonic voltage techniques, ground faults on the bottom 15% of the stator windings may be detected. Overlap between the two detection techniques may be used to provide 100% stator ground fault protection coverage.

It has been observed, however, that where multiple generation units are in a configuration that would allow for circulating third harmonics, the third-harmonic protection becomes less secure. That is, an external third harmonic voltage source may result in an increased measured terminal third harmonic voltage, and a decreased measured neutral third harmonic voltage. In one instance, where the external third harmonic voltage is increased (e.g., 2.4 times) with respect to the internal third harmonic source, the third harmonic protection may declare an internal fault incorrectly. Thus, what is needed is increased security where multiple generators are in a configuration that may result in circulating third harmonic voltage.

Systems and methods of the present application provide two improvements that result in increased security to detect generator ground faults on the entirety of the stator where multiple generators are in a configuration that may result in circulating third harmonics. In one embodiment, the IED may be configured to block protection when an external third harmonic source exceeds a threshold and may cause a misoperation. This embodiment may be implemented in an IED.

Figure 8:
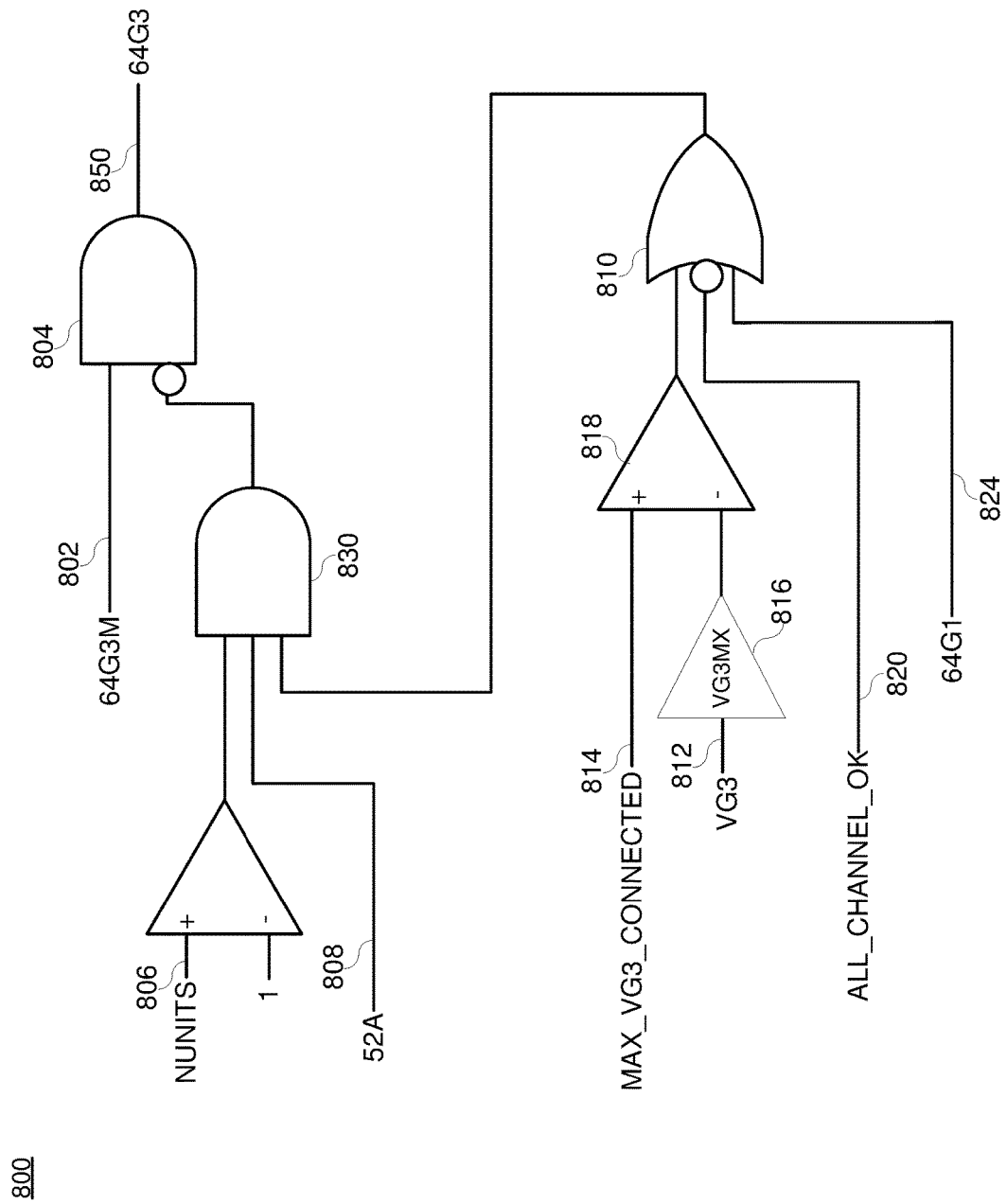
FIG. 8 illustrates logic useful for providing secure ground protection to a generator in a configuration where multiple generators are connected to a common bus in accordance with an embodiment.

FIG. 8 illustrates logic 800 useful for providing secure ground fault protection to a generator in a configuration where multiple generators are connected to a common bus in accordance with several embodiments herein. In particular, the logic illustrated in FIG. 8 is useful to block protection (e.g., block tripping of circuit breakers) when an external third harmonic source is too large. That is, the logic detects an internal ground fault using third harmonics 64G3 and outputs such detection 850 upon occurrence of a detection of the ground fault using third harmonic methods and where no blocking signals are present. To that end, output of AND block 804 is based on both presence of the third-harmonic detection signal 802 and a lack of any asserted signal from AND block 830 (which could be accomplished using the inverter as illustrated). In some embodiments, the third-harmonic detection signal 802 may be generated as described with respect to FIG. 3.

In the illustrated embodiment, AND block 830 is configured to assert if each of the three input conditions are met. In various embodiments, more or fewer conditions may be required for AND 830 to assert. As illustrated, AND 830 asserts if the number of units is greater than one 806. This determines that the number of generator units on a common bus with the protected unit is greater than one. If this is true, then there may be a circulating or external source of third harmonic voltage.

Furthermore, output of AND 830 may be based on whether the generator unit to be protected is connected to the same bus as the other generator(s) 52A 808. Inputs 806 may be a setting provided to the IED at setting time. Input 808 may be obtained by measurement of other electrical or mechanical equipment (e.g. breaker auxiliary contact status), other logic (e.g. open pole detection logic inside the relay) or a Supervisory Control and Data Acquisition (SCADA) system.

If both the number of units is greater than one, and the local unit is connected to the common bus, then AND gate 830 asserts if the output from OR gate 810 indicates that one or more of the following conditions has occurred: 1) the total generator third harmonic 812 of the generator being monitored by the IED times a factor 816 is determined to be less, via comparator 818, than the maximum third harmonic produced by any unit connected to the bus 814; 2) the communication channel 820 is not healthy; or 3) a fundamental ground fault protection 824 has detected a fault. By comparing the total generator third harmonic 812 times a factor 816 of the protected unit to the maximum of the total generator third harmonic produced by any unit connected to the bus 814, the logic 800 may restrain the detection 850 of internal ground faults using third harmonics 64G3 in situations where third harmonics are being produced by other generators that impact the reliability of using the ratio between VN3 and VG3.

The factor (VG3MX) 816 may be a preset setting based on a number of units connected to the common bus. For example, the IED may receive a user selection indicating a number of units connected to the bus and determine, via a lookup table, the factor associated with the number of units. In one embodiment, for a 10% security margin, the factor for two connected generation units may be 1.531; for three connected generation units is 1.372; and for four connected generation units is 1.322. The more the number of generation units connected to the common bus, the higher the VG3 for the protected unit to ensure secure neutral-side third-harmonic protection. An example of where factor 816 may be more relaxed (lower) depends on the system (impedances $X_{t3}$ and $Z_{N3}$) that the function is applied on.

Factor 816 may be a value set by the user and may be adjustable. If the generator capacitance is known then the factor 816 may be given as:

$$VG3MX = \frac{\begin{pmatrix} C_G*(N*(1-64G3P)-0.5) + \\ C_X*(1-64G3P) + \\ \frac{1}{3j\omega R_N}*(N*(1-64G3P)-1) \end{pmatrix}}{(N-1)*\left(\frac{C_G}{2}+\frac{1}{3j\omega R_N}\right)} \quad \text{Eq. 4}$$

where N is the number of generation units connected to the common bus, $C_G$ is a stator-ground capacitance, $C_X$ is a capacitance at the terminals, ω is the angular frequency in which the generator is operating, and RN is the resistance of the neutral-to-ground resistor.

A communication medium between IEDs protecting the various units is necessary to provide protection to the units, and to provide the measured maximum third-harmonic voltage 814. Accordingly, if the communication channel is not healthy, the third harmonic voltage protection is blocked. The communication medium could include any approach that transfers information from one device to another. It could be a digital communications channel, analog channel or directly wired voltage measurements other units. Furthermore, if the fundamental ground fault protection has asserted, the third harmonic voltage protection is blocked.

In various embodiments, one or more of the illustrated inputs to OR 810 may not be used. In one particular embodiment, a blocking signal may assert any time that a factor 816 of the local third harmonic measured 812 is less than the maximum third harmonic voltage 814.

Upon determining that a fault is present via detection 850, the IED may issue a trip command to cause a circuit breaker to open to prevent the generator from continued operation during the fault. In situations with more than one generator, according to one technique, the circuit breakers may be tripped in a pre-determined order. For example, a first IED of a first generator may be preset to trip a circuit breaker at a first time, a second IED of a second generator may be preset to trip a circuit breaker at a second time, after the first time, etc. When the fault is isolated from the common bus then the generator causing the fault has been determined. However, such pre-determined orders may be inefficient and/or cause delays in isolating the fault from the common bus. Accordingly, the IED may utilize a technique to determine a likelihood that a fault is located at a particular generator. The IED may send and receive the determined likelihoods to and from the other IEDs. Further, the IED may determine an order in which to trip circuit breakers based on the likelihoods.

Figure 9:
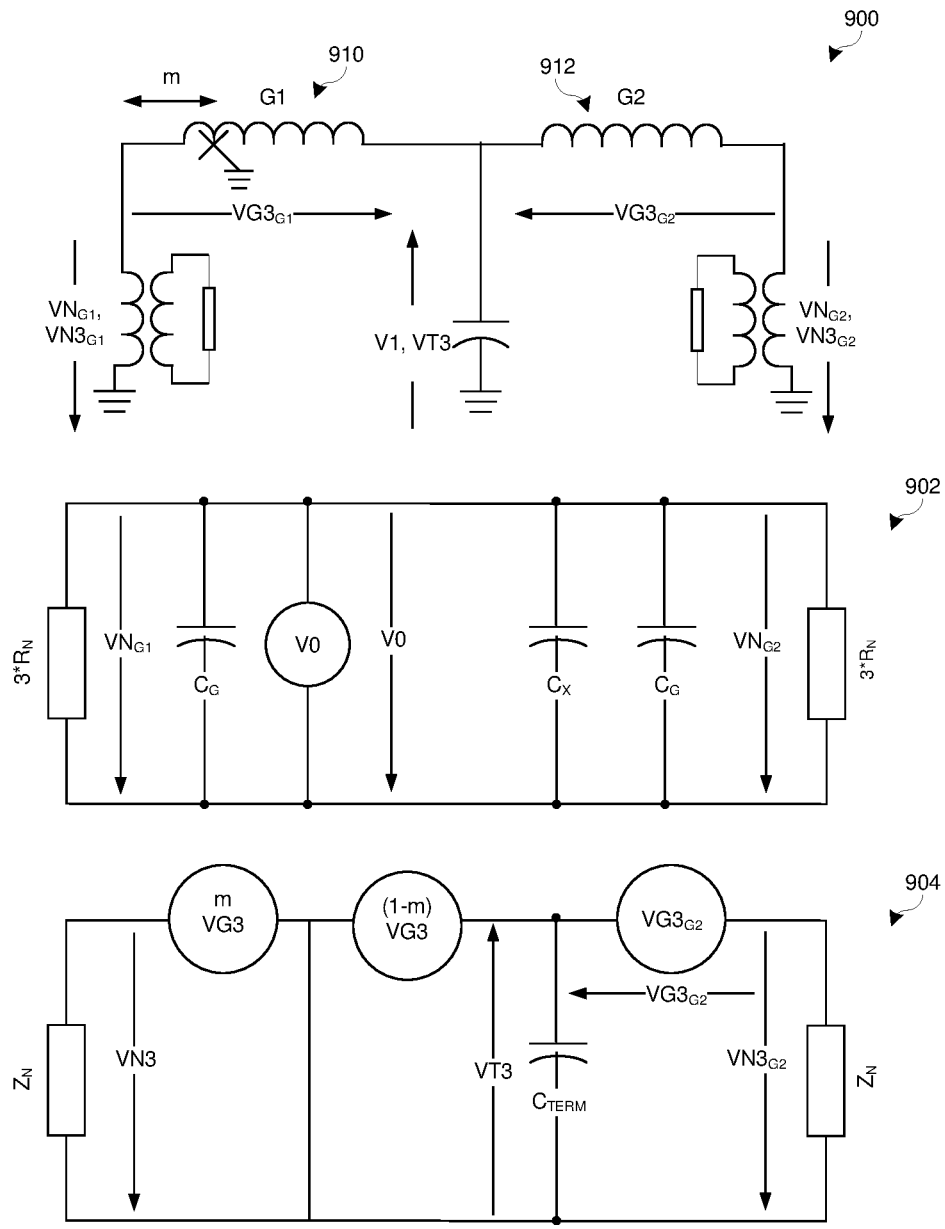
FIG. 9 illustrates a circuit diagram of multiple generators connected to a common bus, in accordance with an embodiment.

FIG. 9 illustrates a single line diagram 900 of a superimposed circuit along with a corresponding fundamental circuit 902 and a third harmonic circuit 904. Upon determining that a ground fault exists, the IED may then determine which circuit breaker to trip. The single line diagram 900 includes windings 910 of a first generator G1 and windings 912 of a second generator G2. The first generator G1 has a neutral voltage $VN_{G1}$ with third harmonic neutral voltage $VN3_{G1}$. The second generator G2 has a neutral voltage $VN_{G2}$ with third harmonic neutral voltage $VN3_{G2}$. Both generator G1 and G2 may have a common positive-sequence terminal voltage V1 and third harmonic terminal voltage VT3 via the common bus. In the illustrated embodiment, a fault occurs at location m in the windings of the first generator G1.

TABLE 1

| $VG3_{G1}$ = 1.00 $VG3_{G2}$ = 1.25 (mismatch = +0.25) | | | | |
|---|---|---|---|---|
| | G1 | | G2 | |
| m | VN/V1 | VN3/VG3 | VN/V1 | VN3/VG3 |
| 0.0 | 0.0 | 0 | 0 | 0.2 |
| 0.15 | 0.15 | 0.15 | 0.15 | 0.32 |
| 0.5 | 0.5 | 0.5 | 0.5 | 0.6 |
| 1.0 | 1.0 | 1.0 | 1.0 | 1.0 |

In an example shown in Table 1, VG3 for G1 is 1 p.u. and VG3 for G2 is 1.25 and the generators are in phase. The ratios of G1 between VN1/V1 and VN3/VG3 are in agreement on the faulted generator but not on the unfaulted generator, except at the terminal.

TABLE 2

| $VG3_{G1}$ = 1.00 $VG3_{G2}$ = 0.80 (mismatch = −0.20) | | | | |
|---|---|---|---|---|
| | G1 | | G2 | |
| m | VN/V1 | VN3/VG3 | VN/V1 | VN3/VG3 |
| 0.0 | 0.0 | 0 | 0 | −0.25 |
| 0.15 | 0.15 | 0.15 | 0.15 | −0.0625 |
| 0.5 | 0.5 | 0.5 | 0.5 | 0.375 |
| 1.0 | 1.0 | 1.0 | 1.0 | 1.0 |

In another example shown in Table 2, VG3 for G1 is 1 p.u. and VG3 for G2 is 0.80 and the generators are in phase. The ratios of G1 between VN1/V1 and VN3/VG3 are in agreement on the faulted generator but not on the unfaulted generator, except at the terminal.

TABLE 3

| $VG3_{G1}$ = 1.00 $VG3_{G2}$ = 1.00 (no mismatch) | | | | |
|---|---|---|---|---|
| | G1 | | G2 | |
| m | VN/V1 | VN3/VG3 | VN/V1 | VN3/VG3 |
| 0.0 | 0.0 | 0 | 0 | 0.0 |
| 0.15 | 0.15 | 0.15 | 0.15 | 0.15 |
| 0.5 | 0.5 | 0.5 | 0.5 | 0.5 |
| 1.0 | 1.0 | 1.0 | 1.0 | 1 |

In a further example shown in Table 3, VG3 for G1 is 1 p.u. and VG3 for G2 is also 1 p.u. and the generators are in phase. That is, there is no difference in third harmonic voltages between the generators G1 and G2. As there is no third harmonic circulation between the generators G1 and G2, the ratios of VN/V1 and VN3/VG3 are in agreement on both machines.

The ratio of neutral third-harmonic normalized with the total generator third harmonic 64G3(|VN3/VG3|) of the faulted unit is the same as the neutral voltage normalized with the positive sequence voltage 59VN1 (|VN/V1|). For the un-faulted units, a different ratio is observed. For example, if we consider Row 2 of Table 1, the difference for the faulted unit is |64G3−59VN1|=|0.15−0.15|=0. For the un-faulted unit, |64G3$_{G2}$−59VN1|=|−0.06−0.15|=0.21.

From the observations in tables 1-3, the IED monitoring each generator may determine a respective biasing factor (e.g. BIAS=87V31). The biasing factor may be associated with a likelihood that the fault is located within the windings of the generator. For example, if the biasing factors of each generator are compared, the generator with the higher biasing factor may be the more likely generator to have a fault within the windings. The biasing factor may be given by:

$$87V31 = 1 - \left|\max\left(\left|\frac{VN3}{VG3}\right|, 1\right) - \left|\frac{VN}{V1}\right|\right| \qquad \text{Eq. 5}$$

In an embodiment that uses the biasing factor of equation (5), the maximum value of 64G3 is limited to 1. In some embodiments, the first biasing factor may be used directly to determine selection of which circuit breaker to trip. In other embodiments, the first biasing factor may be used to determine a total biasing factor of a generator.

Figure 10:
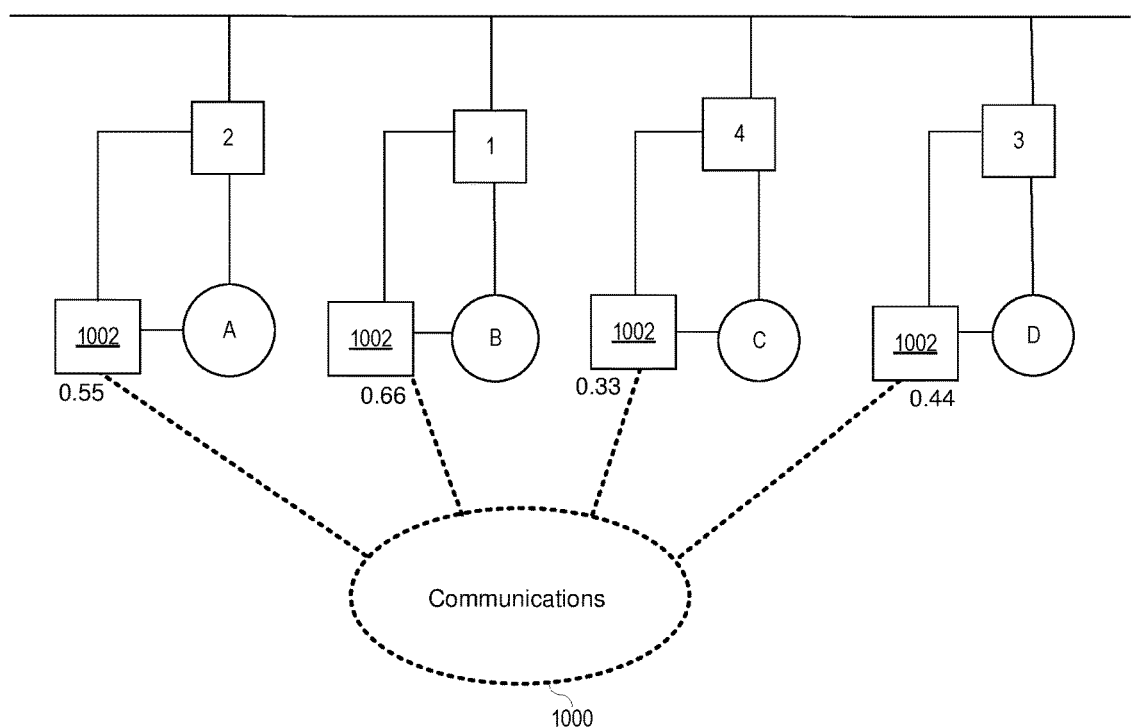
FIG. 10 illustrates a network diagram of IEDs monitoring various generators connected to a common bus, in accordance with an embodiment.

FIG. 10 illustrates a communication network 1000 of IEDs that communicate with one another to selectively trip in a sequence based on the likelihoods that the fault is located at various generators. In the illustrated embodiment, the communication network 1000 includes IEDs 1002, 1004, 1006, and 1008 that each monitor generators A, B, C, and D, respectively. Each of the IEDs 1002, 1004, 1006 and 1008 may determine a biasing factor for the respective generators. The biasing factor may be based on 87V31 or a combination of other factors. For e.g. a second biasing factor (32S) may be achieved via some approach that indicates the direction of the internal fault e.g. If the fault belongs to the protected generating unit, the value of 32S could be 1, if it is external to the protected unit the value could be 0. The overall biasing factor may be given by:

$$\text{BIAS} = \tfrac{2}{3} * 32S + \tfrac{1}{3} * 87V31$$

While weights of ⅔ and ⅓ are used in the example, other combinations of the two factors may be used. 32S may be obtained via other methods. In the illustrated embodiment, the IEDs 1002, 1004, 1006, and 1008 may each send the total biasing factor to each of the other IEDs via the communication channel 1010. As mentioned above, the communication channel 1010 may be any suitable communication channel.

In the illustrated embodiment, IED 1002 may receive each of the total biasing factors from the other IEDs 1004, 1006, and 1008 associated with each of the other generators. The IED 1002 determines a biasing factor of the generator A to be 0.55. The IED 1002 may then determine an order of commands to trip the circuit breakers of the IEDs. As illustrated, the IED 1002 may receive 0.66, 0.33, and 0.44 biasing factors from the IEDs 1004, 1006, and 1008 respectively. Each of the received biasing factors may be based on a likelihood that a fault is located at the respective generator of the IED.

In the illustrated embodiment, the IED 1002 may determine an order of trip commands to be such that the IED 1004 trips a circuit breaker first, the IED 1002 trips a circuit breaker second, the IED 1008 trips a circuit breaker third, and the IED 1006 trips a circuit breaker fourth due to the biasing factors. In some embodiments, the timing at which each of the circuit breakers tripped may be spaced apart a predetermined amount of time. By tripping the IED 1004 first, the generator most likely to have a fault is isolated from the common bus first. As such, the speed at which the generator most likely to have a fault may be isolated faster on average than a technique that uses predetermined ordering.

Figure 11:
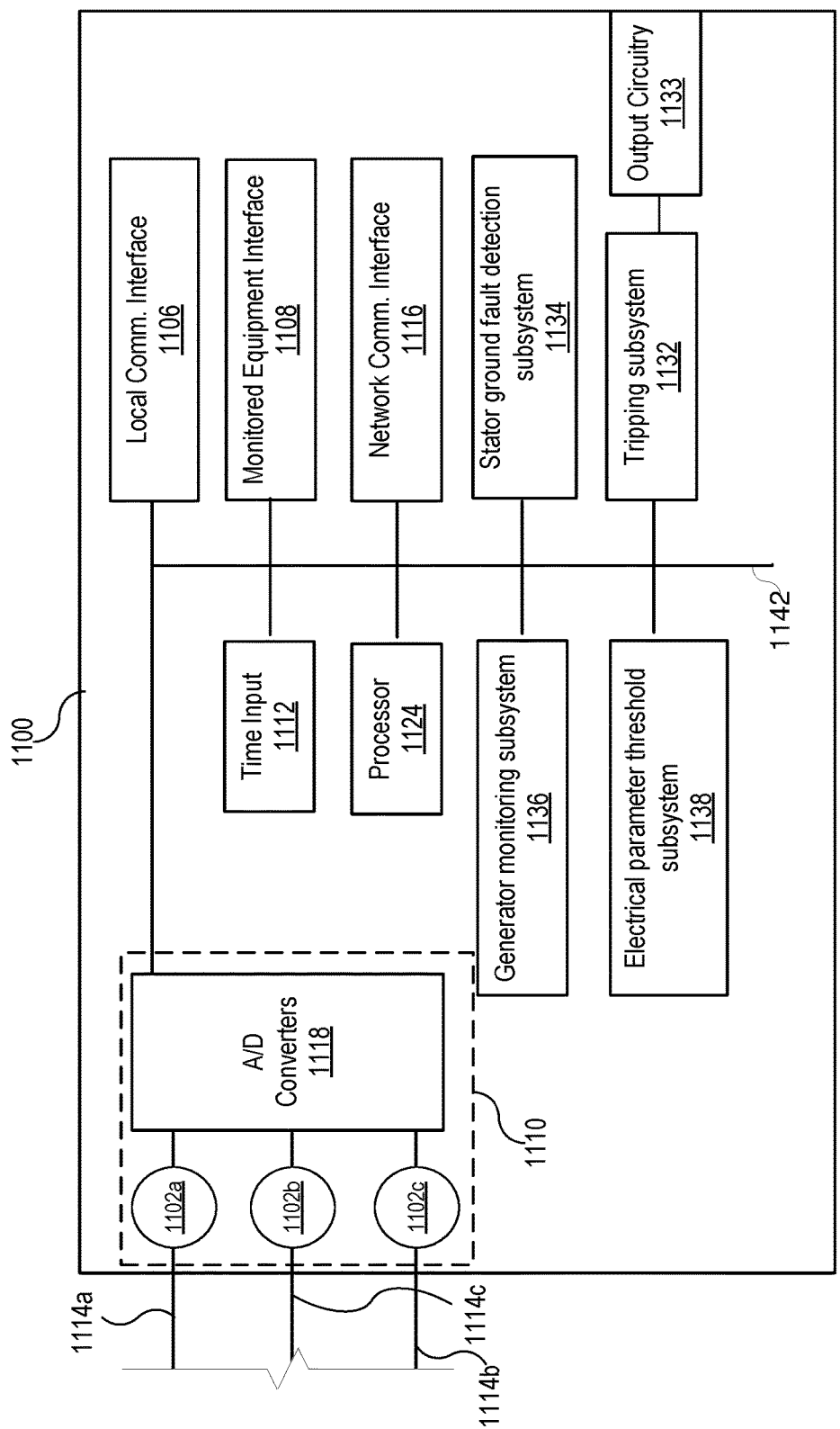
FIG. 11 illustrates a function block diagram of a generator protection element configured to provide stator ground protection, in accordance with an embodiment.

FIG. 11 illustrates a function block diagram of a generator protection element 1100 configured to monitor an electric power generator and provide a variety of protection elements for the electric power generator, including stator ground fault detection and protection when multiple generator units are connected using a common bus, consistent with embodiments of the present disclosure. Generator protection element 1100 may be configured to perform a variety of tasks using a configurable combination of hardware, software, firmware, and/or any combination thereof. FIG. 11 illustrates an embodiment that includes hardware and software, various embodiments of the present disclosure may be implemented in an embedded system, field programmable gate array implementations, and specifically designed integrated circuit. In some embodiments, functions described in connection with various software modules may be implemented in various types of hardware. Moreover, certain components or functions described herein may be associated with other devices or performed by other devices. The specifically illustrated configuration is merely representative of one embodiment consistent with the present disclosure.

Generator protection element 1100 includes a network communications interface 1116 configured to communicate with other IEDs and/or system devices. In certain embodiments, the network communications interface 1116 may facilitate direct communication with another IED or communicate with another IED over a communications network. The network communications interface 1116 may facilitate communications with multiple IEDs. The communications interface 1116 may be used to monitor and determine if the communication channel is healthy and/or to determine an order of circuit breakers to trip. Note that any suitable communication network and/or communication channel may be used to communicate voltage data, quality of the communicated information, the biasing factors, or any other suitable data that may be communicated between the generators. Further, any suitable communication protocol to communicate the data may be used, such as Ethernet, Synchrophasor, DB9, peer-to-peer, or a proprietary protocol, among others.

Generator protection element 1100 may further include a time input 1112, which may be used to receive a time signal allowing generator protection element 1100 to apply a time-stamp to the acquired samples. In certain embodiments, a common time reference may be received via communications interface 1116, and accordingly, a separate time input may not be required for time-stamping and/or synchronization operations. One such embodiment may employ the IEEE 1588 protocol. A monitored equipment interface 1108 may be configured to receive status information from, and issue control instructions to, a piece of monitored equipment. In some embodiments, the monitored equipment may be a generator, and generator protection element 1100 may be configured to control the operation of the generator.

A local communication interface 1106 may also be provided for local communication with generator protection element 1100. The local communication interface 1106 may be embodied in a variety of ways, including as a serial port, a parallel port, a Universal Serial Bus (USB) port, an IEEE 1394 Port, and the like.

In certain embodiments, generator protection element 1100 may include a sensor component 1110 (e.g., sensor circuitry). In the illustrated embodiment, sensor component 1110 is configured to gather data directly from a plurality of conductors 1114a-c and may use, for example, A/D converters 1118 that may sample and/or digitize filtered waveforms to form corresponding digitized current and voltage signals provided to data bus 1142. Conductors 1114a-c may be electrically connected to an output of a generator, such as to the terminals of the electric power generator. In some embodiments transformers (1102a, 1102b, 1102c) may reduce the voltage or current to a level appropriate for monitoring the generator using protection element 1100. A/D converters 1118 may include a single A/D converter or separate A/D converters for each incoming signal. A current signal may include separate current signals from each phase of a three-phase electric power system. A/D converters 1118 may be connected to processor 1124 by way of data bus 1142, through which representations of electrical parameters determined by sensor elements 1102*a-c* may be transmitted to processor 1124. In various embodiments, the representations of electrical parameters may represent parameters, such as currents, voltages, frequencies, phases, and other parameters associated with an electric power distribution system. Sensor elements 1102*a-c* may represent a variety of types of elements, such as voltage transformers, current transformers, status inputs, a breaker controller, etc. Sensor component 1110 may be configured to receive signals from the electrical generator or conductors connected thereto such as, for example, as illustrated and described in conjunction with FIG. 7.

Processor 1124 may be configured to process communications received via communications interface 1116, time input 912, monitored equipment interface 1108, local communications interface 1106, and/or sensor component 1110. Processor 1124 may operate using any number of processing rates and architectures. Processor 1124 may be configured to perform various algorithms and calculations described herein. Processor 1124 may be embodied as a general purpose integrated circuit, an application specific integrated circuit, a field-programmable gate array, and/or any other suitable programmable logic device. In some embodiments, the processor 1124 may be generally referred to as processing circuitry.

A generator monitoring subsystem 1136 may be configured to monitor the generator using measured values (currents, voltages, etc.) and/or values received over communications. In various embodiments, data received from A/D converters 1118 may be analyzed by the generator monitoring subsystem 1136. Further, such data may be stored for later use and/or transmitted by generator protection element 1100 to another device or system in communication with generator protection element 1100.

An electrical parameter threshold subsystem 1138 may be configured to compare the calculated or estimated third harmonic values of the generator to a characteristic or thresholds as described above. The tripping characteristic may be represented, in various embodiments, as a mathematical function relating the stator ground fault protection as described herein. A variety of types of functions may be used in embodiments consistent with the present disclosure.

A tripping subsystem 1132 may be configured to issue a trip command based upon satisfaction of the tripping characteristic. In various embodiments, the tripping subsystem 1132 may be in communication with a breaker, recloser, or other device that may be configured to interrupt an electrical connection between the generator and an electric power generation and transmission system.

The tripping subsystem 1132 may issue trip commands via an electrical or electromechanical interrupter, such as output circuitry 1133. The output circuitry 1133 may be electrically coupled to the circuit breaker. The processor 1124 may selectively cause the output circuitry 1133 to send a signal to the circuit breaker to open the circuit breaker based at least in part on the determination performed with respect to FIG. 8. That is, the output circuitry 1133 may securely and selectively interrupt an electrical connection between the generator and the electric power generation and transmission system based on the trip command from the tripping subsystem 1132.

In some embodiments, generator protection element 1100 may be configured to issue trip commands upon detection of the stator ground fault or other protection elements. The stator ground fault detection subsystem 1134 may be configured in various embodiments to detect a stator ground fault condition according to several embodiments herein. The various third harmonic and fundamental stator ground fault detection embodiments described herein, including blocking schemes, may be implemented in the stator ground fault detection subsystem 1134.

Figure 12:
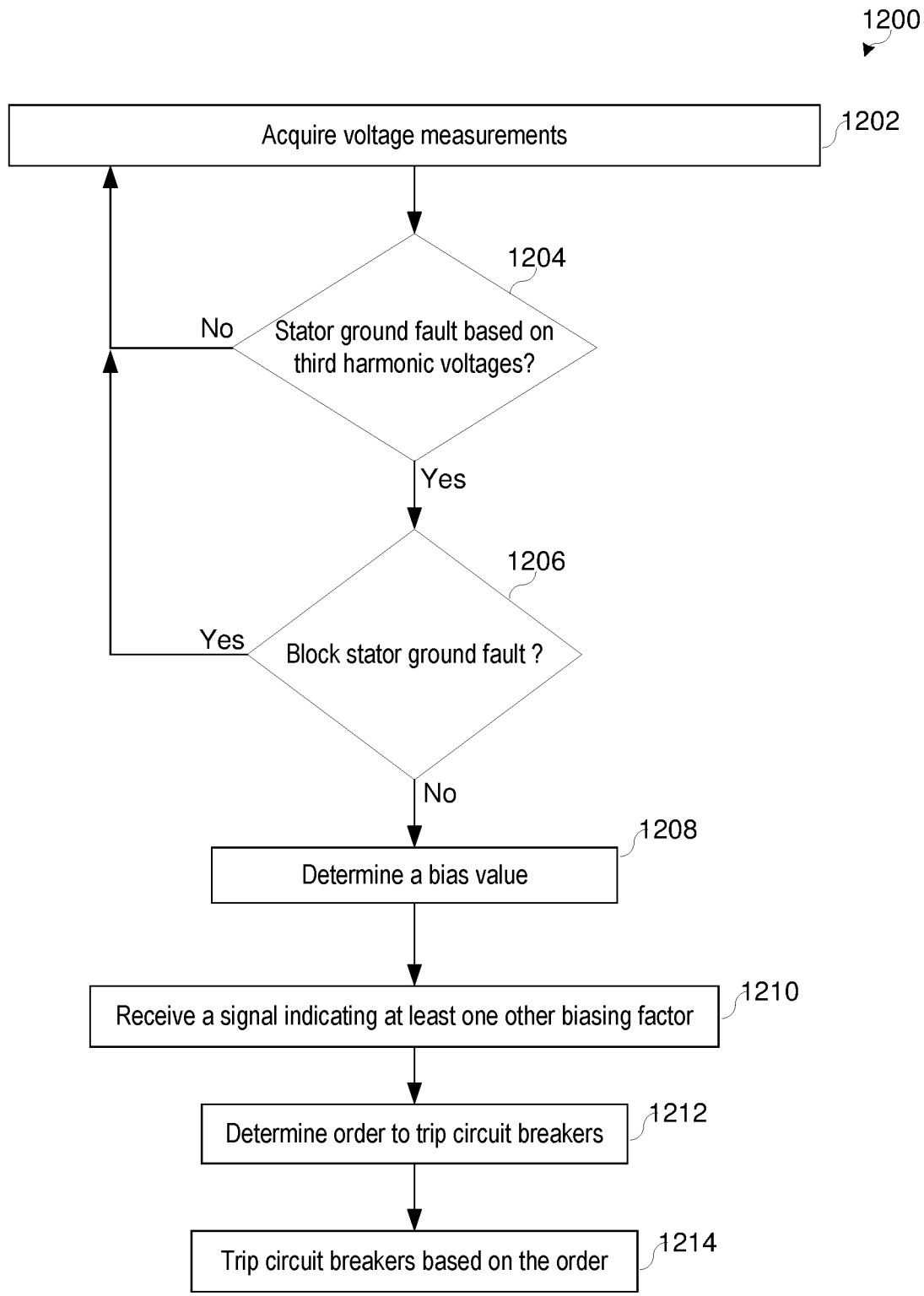
FIG. 12 illustrates a flow chart of a process that may be performed by the generator protection element of FIG. 11, in accordance with an embodiment.

FIG. 12 illustrates a flow chart of an example of a process 1200 that may be performed by the processor 1124 of an IED to perform the methods described in FIGS. 8-10. The process 1200 may be stored as instructions in one or more of the subsystems (e.g., computer-readable mediums) to cause the processor to perform one or more of the steps described herein. In the process 1200, the IED may be monitoring a first generator, and another IED may be monitoring a second generator on a common bus with the first generator.

The process 1200 may begin by acquiring voltage measurements of a generator (block 1202). For example, the processor 1124 may receive a terminal voltage measurement and a neutral voltage measurement via the sensor circuitry 1110. The processor 1124 may apply a filter to the terminal voltage measurement and the neutral voltage measurement to obtain a third harmonic terminal voltage and a third harmonic neutral voltage. The processor 1124 may determine a third harmonic generator voltage based on the third harmonic terminal voltage and the third harmonic neutral voltage.

The processor 1124 may determine whether a stator ground fault has occurred (diamond 1204) based on the third harmonic voltages, such as the third harmonic terminal voltage, the third harmonic neutral voltage, and the third harmonic generator voltage as described with equations 1-3.

For various reasons, using third harmonic voltages without other measurements may indicate that a stator ground fault has occurred when a stator ground fault is not actually present. To securely determine whether a stator ground fault has occurred, the processor 1124 may determine whether to block the third harmonic stator ground fault determination (diamond 1206) when factors other than third harmonic voltages indicate that the third harmonic voltage determination (from diamond 1204) may be incorrect. Securely may refer to limiting detection of stator ground faults from third harmonic voltages to when the stator ground faults are confirmed to be present, for example, based on other generators on the common bus, the communication network, and other fault detection assertions, among others. For instance, if more than one generator share a common bus, the processor 1124 may block the third harmonic stator ground fault determination when one of the other generator third harmonic voltages affect stator ground fault detection using third harmonic voltages.

If the processor 1124 determines not to block the stator ground fault, the processor 1124 may determine a biasing factor (block 1208) associated with a likelihood that the stator ground fault is present at the first generator being monitored by the IED.

The processor 1124 may receive a signal indicating another biasing factor (block 1210) from another IED monitoring the second generator. While two generators are used in this example, the IED may receive any suitable number of biasing factors from IEDs of other generators. The processor 1124 may determine an order to trip the circuit breakers of each generator based on each of the biasing factors. For example, the circuit breakers may be ordered to trip from the generator most likely to have a stator ground fault to the generator least likely to have a stator ground fault.

The processor 1124 may proceed by tripping the circuit breaker monitored by the IED based on the order (block 1214). In some embodiments, the order may be communicated via the communication channel. The IED may wait an amount of time based on the position of the monitored generator in the determined order. By tripping circuit breakers in an order based at least in part on the likelihood that a fault is present at the generator, the generator having the stator ground fault may be selectively electrically disconnected from the common bus in a more efficient manner than using a predetermined order for tripping generators.

The above description provides numerous specific details for a thorough understanding of the embodiments described herein. However, those of skill in the art will recognize that one or more of the specific details may be omitted, or other methods, components, or materials may be used. In some cases, operations are not shown or described in detail. Furthermore, an Appendix is attached hereto and made a part hereof, which further describes and details embodiments of the invention described herein.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system, comprising:
    a generator configured to generate electrical energy for an electric power delivery system, in electrical communication with common bus for providing the electrical energy to the common bus;
    an intelligent electronic device (IED), comprising:
        a generator monitoring subsystem configured to measure a neutral voltage value and a terminal voltage value of the generator;
        a stator ground fault detection subsystem in communication with the generator monitoring subsystem and configured to determine a stator ground fault using a neutral voltage and terminal voltage value from the generator monitoring subsystem, and to block a determination of the stator ground fault when a factor of the third harmonic voltage from the generator is less than a maximum third harmonic voltage from another generator in electrical communication with the common bus;
        a tripping subsystem configured to issue a trip command based upon satisfaction of the stator ground fault detection and absence of the block; and,
    an electrical interrupter configured to securely and selectively interrupt an electrical connection between the generator and the electric power generation and transmission system based on the trip command.

2. The system of claim 1, wherein the stator ground fault detection subsystem is further configured to block the determination when a communication channel is faulty.

3. The system of claim 1, wherein the stator ground fault detection subsystem is further configured to block the determination when a stator ground fault is detected using fundamental measurements.

4. The system of claim 1, wherein the stator ground fault detection subsystem is configured to determine whether a total number of generators electrically connected to the common bus is greater than one.

5. The system of claim 1, wherein the stator ground fault detection subsystem is configured to receive an input indicating that the generator and another generator are electrically connected to the common bus.

6. The system of claim 1, wherein the stator ground fault detection subsystem is configured to select the factor based at least in part on a number of total generators electrically connected to the common bus.

7. The system of claim 1, wherein the stator ground fault detection subsystem is configured to receive a user input indicating the factor to be used.

8. The system of claim 1, wherein the stator ground fault detection subsystem is configured to:
    calculate a ratio of a generator neutral third harmonic voltage value and the generator third harmonic voltage value; and
    when the ratio is less than a predetermined threshold, determining the stator ground fault is present.

9. A method of monitoring an electrical generator using a generator protection element, comprising:
    measuring a neutral voltage and a terminal voltage of a generator;
    determining a generator third harmonic voltage value using the neutral and terminal voltages;
    calculating a ratio of a generator neutral third harmonic voltage value and the generator third harmonic voltage value;
    when the ratio is less than a predetermined threshold, determining a stator ground fault condition;
    blocking the stator ground fault detection based at least in part on:
        a factor of the generator third harmonic voltage value being less than a maximum third harmonic voltage value from another generator in electrical communication with a common bus of the generator;
        a communication channel of the bus being not healthy;
        a fundamental ground fault protection system detecting a fault on the generator; or
        any combination thereof; and
    issuing a trip command based upon the declared stator ground fault condition.

10. The method of claim 9, wherein the predetermined threshold is associated with a percentage of windings to be protected on the electrical generator using the generator third harmonic voltage.

11. The method of claim 9, comprising blocking the stator ground fault detection based at least in part on a total number of generators on the common bus.

12. The method of claim 9, comprising receiving a user setting indicating the factor.

13. An intelligent electronic device (IED) for monitoring a generator on a common bus of an electric power delivery system, comprising:
    a memory;
    a processor operatively connected to the memory, wherein the processor is configured to execute instructions stored on the memory to cause the processor to:
        receive voltage measurements of the generator;

determine that a stator ground fault has occurred based on the voltage measurements;

determine a biasing factor associated with a likelihood that the stator ground fault has occurred at the generator;

receive at least one other biasing factor associated with a likelihood that the stator ground fault has occurred on an at least one other generator on the common bus;

determine an order in which to trip a circuit breaker of the generator and an at least one other circuit breaker of the at least one other generator based at least in part on the biasing factor and the at least one other biasing factor; and send a signal to cause the circuit breaker of the generator to trip based on the order.

14. The IED of claim 13, wherein the processor is configured to execute instructions stored on the memory to cause the processor to block the determination that the stator ground fault has occurred when a communication channel between the generator and another generator is not healthy.

15. The IED of claim 13, wherein the processor is configured to execute instructions stored on the memory to cause the processor to block the determination that the stator ground fault has occurred when another ground fault protection system of the generator has detected a fault.

16. The IED of claim 13, wherein the processor is configured to execute instructions stored on the memory to cause the processor to receive an input indicating that the generator and another generator are electrically connected to the common bus.

17. The IED of claim 13, wherein the processor is configured to execute instructions stored on the memory to cause the processor to trip the circuit breaker of the generator before the at least one other circuit breaker is tripped when the biasing factor indicates that the generator has a higher likelihood of having the stator ground fault than the at least one other generator.

18. The IED of claim 13, wherein the processor is configured to execute instructions stored on the memory to cause the processor to determine the biasing factor based at least in part on a ratio of a third harmonic neutral voltage of the generator to a third harmonic generator voltage of the generator and a ratio of a neutral voltage of the generator to a positive sequence voltage of the generator.

19. The IED of claim 13, wherein the processor is configured to execute instructions stored on the memory to cause the processor to determine the biasing factor using the equation:

$$BIAS = \tfrac{2}{3}*32S + \tfrac{1}{3}*87V31$$

where 32S is a value that indicates the direction of the stator ground fault and 87V31 is a value that indicates the likelihood the stator ground fault is within the windings of the generator.

20. The IED of claim 19, wherein the processor is configured to execute instructions stored on the memory to cause the processor to determine 87V31 using the equation:

$$87V31 = 1 - \left| \max\left( \left|\frac{VN3}{VG3}\right|, 1 \right) - \left|\frac{VN}{V1}\right| \right|$$

where VN3 is a third harmonic neutral voltage of the generator, VG3 is a third harmonic generator voltage, VN is a neutral voltage of the generator, and V1 is a generator positive-sequence voltage.

* * * * *